United States Patent
Ouyang et al.

(10) Patent No.: US 12,284,869 B2
(45) Date of Patent: Apr. 22, 2025

(54) DISPLAY PANEL INCLUDING ULTRAVIOLET BLOCKING LAYER COVERING BENDING AREA, AND MOBILE TERMINAL INCLUDING DISPLAY PANEL

(71) Applicant: Wuhan China Star Optoelectronics Semiconductor Display Technology Co., Ltd., Wuhan (CN)

(72) Inventors: Qi Ouyang, Wuhan (CN); Xuehuan Song, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/621,881

(22) PCT Filed: Dec. 10, 2021

(86) PCT No.: PCT/CN2021/136974
§ 371 (c)(1),
(2) Date: Dec. 22, 2021

(87) PCT Pub. No.: WO2023/092687
PCT Pub. Date: Jun. 1, 2023

(65) Prior Publication Data
US 2024/0298481 A1    Sep. 5, 2024

(30) Foreign Application Priority Data
Nov. 29, 2021   (CN) .......................... 202111430715.7

(51) Int. Cl.
*H10K 50/86*    (2023.01)
*H10K 59/12*    (2023.01)
(Continued)

(52) U.S. Cl.
CPC ....... *H10K 50/865* (2023.02); *H10K 59/1201* (2023.02); *H10K 59/131* (2023.02); *H10K 59/8792* (2023.02); *H10K 2102/311* (2023.02)

(58) Field of Classification Search
CPC ........ H10K 50/00; H10K 50/10; H10K 50/80; H10K 50/865; H10K 50/88; H10K 59/00;
(Continued)

(56) References Cited

U.S. PATENT DOCUMENTS

| 2011/0127498 | A1 | 6/2011 | Jung |
| 2017/0317299 | A1 | 11/2017 | Choi |
| 2020/0264668 | A1* | 8/2020 | Baek ...................... H05K 1/118 |

FOREIGN PATENT DOCUMENTS

| CN | 1575060 A | 2/2005 |
| CN | 103579287 A | 2/2014 |

(Continued)

OTHER PUBLICATIONS

International Search Report in International application No. PCT/CN2021/136974, mailed on Apr. 26, 2022.
(Continued)

*Primary Examiner* — Cheung Lee
(74) *Attorney, Agent, or Firm* — Nathan & Associates; Menachem Nathan

(57) ABSTRACT

The present application provides a display panel, a manufacturing method thereof, and a mobile terminal. The display panel includes a display area and a bending area located at a side of the display area. The display panel includes a base, a metal layer and an organic film layer, which are laminated in order. The metal layer includes a metal trace, and at least a part of the metal trace is located in the bending area. The organic film layer at least covers the metal trace. The display panel further includes an ultraviolet blocking layer disposed at a side of the organic film layer away from the metal layer.

(Continued)

A projection of the ultraviolet blocking layer covers the bending area.

20 Claims, 3 Drawing Sheets

(51) Int. Cl.
*H10K 59/131* (2023.01)
*H10K 59/80* (2023.01)
*H10K 102/00* (2023.01)

(58) Field of Classification Search
CPC .... H10K 59/10; H10K 59/12; H10K 59/1201; H10K 59/131; H10K 59/17; H10K 59/179; H10K 59/19; H10K 59/80; H10K 59/8792; H10K 2102/311
See application file for complete search history.

(56) References Cited

FOREIGN PATENT DOCUMENTS

| | | |
|---|---|---|
| CN | 105097831 A | 11/2015 |
| CN | 106449658 A | 2/2017 |
| CN | 109817691 A | 5/2019 |
| CN | 109873003 A | 6/2019 |
| CN | 109920332 A | 6/2019 |
| CN | 110010794 A | 7/2019 |
| CN | 110853517 A | 2/2020 |
| CN | 111312930 A | 6/2020 |
| CN | 111524902 A | 8/2020 |
| CN | 111694465 A | 9/2020 |
| CN | 211787964 U | 10/2020 |
| CN | 112542499 A | 3/2021 |
| CN | 114156280 A | 3/2022 |
| JP | 2020002196 A | 1/2020 |
| KR | 100770127 B1 | 10/2007 |

OTHER PUBLICATIONS

Written Opinion of the International Search Authority in International application No. PCT/CN2021/136974, mailed on Apr. 26, 2022.

Chinese Office Action issued in corresponding Chinese Patent Application No. 202111430715.7 dated Jan. 18, 2023, pp. 1-6.

* cited by examiner

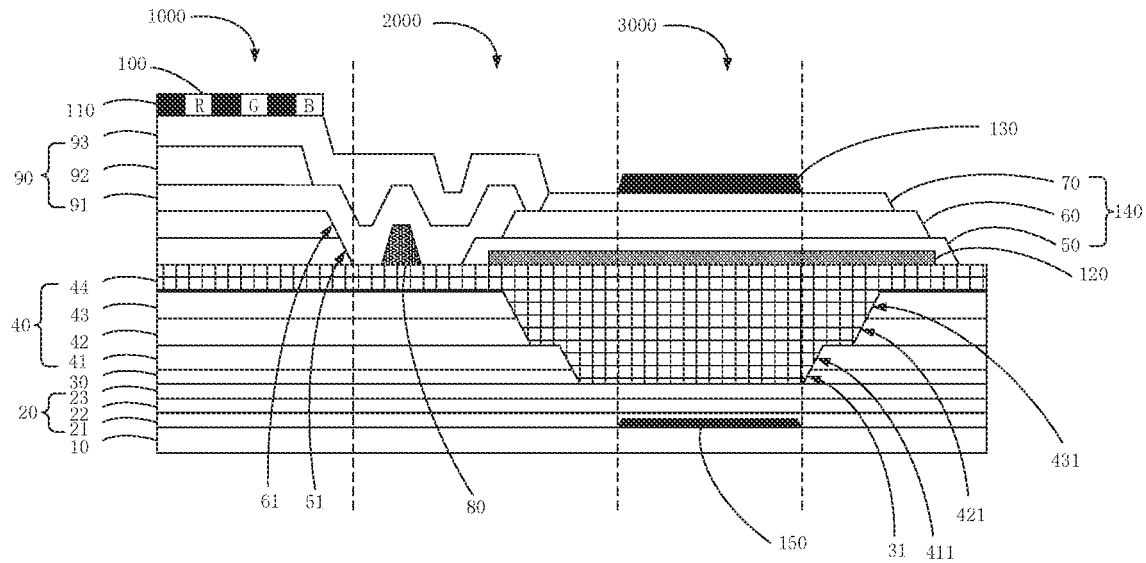

FIG. 5 providing a base and sequentially fabricating a metal layer and an organic film layer on the base, wherein the metal layer comprises a metal trace, at least a part of the metal trace is located in the bending area, and the organic film layer covers at least the metal —— S10 fabricating an ultraviolet blocking layer on the organic film layer, wherein a projection of the ultraviolet blocking layer covers the bending area —— S20

FIG. 6

DISPLAY PANEL INCLUDING ULTRAVIOLET BLOCKING LAYER COVERING BENDING AREA, AND MOBILE TERMINAL INCLUDING DISPLAY PANEL

FIELD OF THE DISCLOSURE

The present invention relates to display technologies, and more particularly to a display panel, a manufacturing method thereof, and a mobile terminal.

DESCRIPTION OF RELATED ARTS

Organic light-emitting diode (OLED) display screens are display screens fabricated using organic electroluminescent diodes. The OLED display screens have excellent properties such as having self-luminous organic electroluminescent diodes, no backlights, high contrasts, thin thicknesses, wide viewing angles, and fast responses, being applicable to flexible displays, having wide operating temperature ranges, and simpler structures and fabrication processes.

At present, full-screen borderless display products can provide users a better viewing experience, and this will bring a new consumer market. Pad bending is a core technology of full-screen borderless OLED display products. Therefore, each company is developing pad bending technology in order to reduce the size of a bezel and achieve a larger screen-to-body ratio. In the existing art, the display panel is divided into a display area, a transition area and a bending area. The display panel includes metal traces located in the bending area and an organic film layer covering the metal traces. When the bending radius of the display panel is small in the bending area, or when the elastic modulus of the organic film layer increases and the stretching rate decreases due to irradiation of ultraviolet light during manufacturing processes of the display panel, it will increase a risk that the metal traces are broken, thereby causing the display panel to have poor vertical bright lines.

SUMMARY

Technical Problems

The embodiments of the present application provide a display panel and a mobile terminal, for alleviating the risk that the metal trace of the existing display panel is broken in the bending area.

Technical Solutions

The achieve above objective, the embodiments of the present application provide a display panel, a manufacturing method thereof, and a mobile terminal, the display panel includes a display area and a bending area located at a side of the display area;
the display panel includes a base, a metal layer and an organic film layer, which are laminated in order, the metal layer includes a metal trace, at least a part of the metal trace is located in the bending area, and the organic film layer at least covers the metal trace,
wherein the display panel further includes an ultraviolet blocking layer disposed at a side of the organic film layer away from the metal layer, and a projection of the ultraviolet blocking layer covers the bending area.

In the display panel provided in an embodiment of the present application, a material of the ultraviolet blocking layer includes a light absorbing material.

In the display panel provided in an embodiment of the present application, the display panel further includes a pad layer disposed at a side of the organic film layer away from the metal layer, the pad layer includes the ultraviolet blocking layer, and the ultraviolet blocking layer is located in the bending area.

In the display panel provided in an embodiment of the present application, the material of the ultraviolet blocking layer further includes a photoresist material, the light absorbing material is an ultraviolet light absorber, and the ultraviolet light absorber is uniformly distributed in the ultraviolet blocking layer.

In the display panel provided in an embodiment of the present application, the organic film layer includes an organic flat layer and a pixel definition layer, which are laminated, a portion of at least one of the organic flat layer and the pixel definition layer located in the bending area is filled with the ultraviolet light absorber.

In the display panel provided in an embodiment of the present application, a portion of the organic flat layer located in the bending area is filled with the ultraviolet light absorber, and a portion of the pixel definition layer located in the bending area is filled with the ultraviolet light absorber.

In the display panel provided in an embodiment of the present application, in the ultraviolet blocking layer, mass fraction of the ultraviolet light absorber is 10% to 50%.

In the display panel provided in an embodiment of the present application, the light absorbing material is a material of a black matrix.

In the display panel provided in an embodiment of the present application, the display panel further includes a glass substrate located at a side of the base away from the metal layer and a shielding layer located between the glass substrate and the base, a material of the shielding layer is as same as a material of the ultraviolet blocking layer, and an orthographic projection of the ultraviolet blocking layer onto the glass substrate overlaps with an orthographic projection of the shielding layer onto the glass substrate.

In the display panel provided in an embodiment of the present application, a thickness of the ultraviolet blocking layer ranges from 1 um to 1.5 um.

The embodiments of the present application provide a method of manufacturing a display panel, the display panel including a display area and a bending area located at a side of the display area, the manufacturing method including the steps of:
 providing a base and sequentially fabricating a metal layer and an organic film layer on the base, wherein the metal layer includes a metal trace, at least a part of the metal trace is located in the bending area, and the organic film layer covers at least the metal trace; and
 fabricating an ultraviolet blocking layer on the organic film layer, wherein a projection of the ultraviolet blocking layer covers the bending area.

In the method of manufacturing the display panel provided in an embodiment of the present application, the step of fabricating the ultraviolet blocking layer on the organic film layer includes:
 fabricating a pad layer at a side of the organic film layer away from the second metal layer, wherein the pad layer includes the ultraviolet blocking layer, a material of the ultraviolet blocking layer includes a photoresist material and an ultraviolet light absorber, and the ultraviolet light absorber is uniformly distributed in the ultraviolet blocking layer.

In the method of manufacturing the display panel provided in an embodiment of the present application, the step of fabricating the ultraviolet blocking layer on the organic film layer includes:

fabricating a thin-film encapsulating layer on the organic film layer; and fabricating a black matrix and the ultraviolet blocking layer on the thin-film encapsulating layer at the same time, wherein the ultraviolet blocking layer is located in the bending area, and a material of the ultraviolet blocking layer is as same as a material of the black matrix.

The embodiments of the present application provide a mobile terminal, including a terminal body and a display panel, the terminal body and the flexible display module are combined as one;

the display panel includes a display area and a bending area located at a side of the display area;

the display panel includes a base, a metal layer and an organic film layer, which are laminated in order, the metal layer includes a metal trace, at least a part of the metal trace is located in the bending area, and the organic film layer at least covers the metal trace, wherein the display panel further includes an ultraviolet blocking layer disposed at a side of the organic film layer away from the metal layer, and a projection of the ultraviolet blocking layer covers the bending area.

In the mobile terminal provided in an embodiment of the present application, a material of the ultraviolet blocking layer includes a light absorbing material.

In the mobile terminal provided in an embodiment of the present application, the display panel further includes a pad layer disposed at a side of the organic film layer away from the metal layer, the pad layer includes the ultraviolet blocking layer, and the ultraviolet blocking layer is located in the bending area.

In the mobile terminal provided in an embodiment of the present application, the material of the ultraviolet blocking layer further includes a photoresist material, the light absorbing material is an ultraviolet light absorber, and the ultraviolet light absorber is uniformly distributed in the ultraviolet blocking layer.

In the mobile terminal provided in an embodiment of the present application, the organic film layer includes an organic flat layer and a pixel definition layer, which are laminated, a portion of at least one of the organic flat layer and the pixel definition layer located in the bending area is filled with the ultraviolet light absorber.

In the mobile terminal provided in an embodiment of the present application, a portion of the organic flat layer located in the bending area is filled with the ultraviolet light absorber, and a portion of the pixel definition layer located in the bending area is filled with the ultraviolet light absorber.

In the mobile terminal provided in an embodiment of the present application, in the ultraviolet blocking layer, mass fraction of the ultraviolet light absorber is 10% to 50%.

Beneficial Effects

The embodiments of the present application provide a display panel, a manufacturing method thereof, and a mobile terminal. The display panel includes a display area and a bending area located at a side of the display area. The display panel includes a base, a metal layer and an organic film layer, which are laminated in order. The metal layer includes a metal trace, and at least a part of the metal trace is located in the bending area. The organic film layer at least covers the metal trace. In the present application, an ultraviolet blocking layer is disposed at a side of the organic film layer away from the metal layer. A projection of ultraviolet blocking layer covers the bending area. In this way, drawbacks of the existing art are avoided, that is, an increase of the elastic modulus of the organic film layer and a decrease of the stretching rate of the organic film layer are caused when the organic film layer is irradiated by the ultraviolet light, and as a result, it is easy for the organic film layer in the bending area to have cracks, and the metal trace located below the organic layer thus has a risk of being broken, thereby causing poor vertical bright lines for the display panel.

DESCRIPTION OF DRAWINGS

The technical solutions and other beneficial effects of the present application will be more apparent with reference to the detailed descriptions of the embodiments of the present application below in accompanying with the drawings.

FIG. 5 is a fourth type of schematic cross-sectional view of a display panel provided in an embodiment of the present application.

FIG. 6 is a flowchart of a method of manufacturing a display panel provided in an embodiment of the present application.

DESCRIPTION OF EMBODIMENTS OF THE DISCLOSURE

The present application provides a display panel, a manufacturing method thereof and a mobile terminal. To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

The embodiments of the present application provide a display panel, a manufacturing method thereof and a mobile terminal. Detailed description is provided below. It is noted that the order in describing the following embodiments is not intended to be treated as an order of preferred embodiments.

Figure 1:
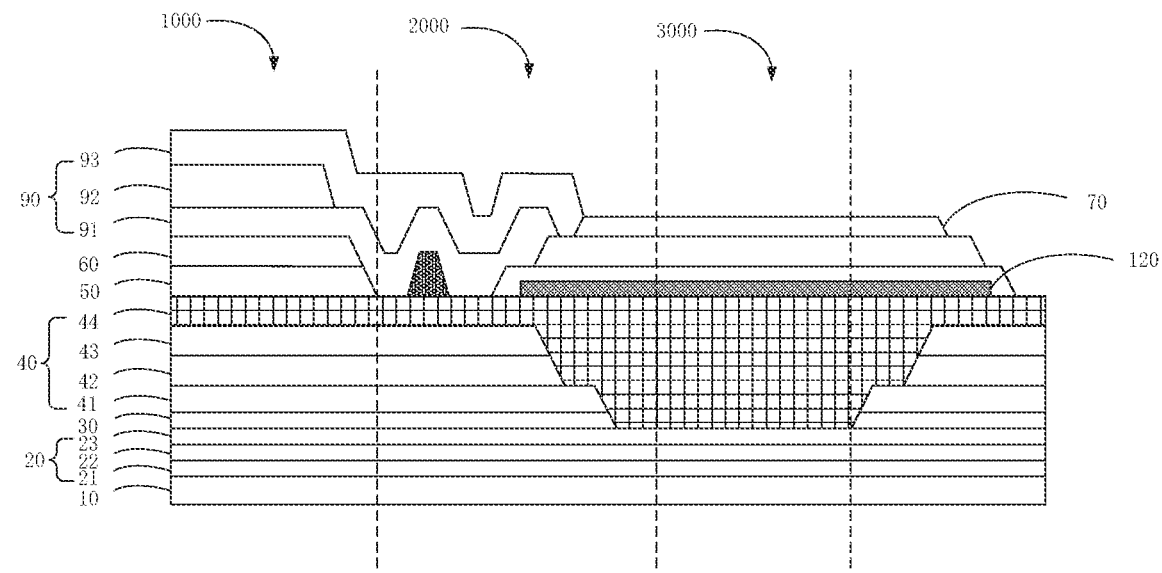
FIG. 1 is a schematic cross-sectional view of an existing display panel.

FIG. 1 is a schematic cross-sectional view of an existing display panel.

The existing display panel includes a display area 1000, a bending area 3000, and a transition area 2000 located between the display area 1000 and the bending area 3000. The display panel includes a glass substrate 10, a base 20, a buffer layer 30, an array substrate 40, a second flat layer 50, a pixel definition layer 60, a pad layer 70 and a thin-film encapsulating layer 90, which are laminated. The array substrate 40 includes an active layer (not shown in the figure), a first gate insulating layer 41, a first gate layer (not shown in the figure), a second gate insulating layer 42, a dielectric layer 43, a first metal layer (not shown in the figure), a first flat layer 44 and a second metal layer (not marked in the figure). The second metal layer includes a metal trace 120 located between the first flat layer 44 and the second flat layer 50. The metal trace 120 extends from the transition area 2000 to the bending area 3000. Both the first flat layer 44 and the pad layer 70 cover the metal trace 120. Both the first flat layer 44 and the pad layer 70 are organic layers.

In the existing art, when ultraviolet light irradiates at the organic layer, it will cause an increase of the elastic modulus of the organic layer and a decrease of the stretching rate of the organic layer. As a result, it is easy for the organic layer in the bending area 3000 to have cracks, and the metal trace 120 located below the organic layer thus has a risk of being broken, thereby causing poor vertical bright lines for the display panel. Examples of irradiating the organic layer using the ultraviolet light include, not are not limited to, using the ultraviolet light to fabricate film layers of the display panel. Based on this, the embodiments of the present application provide a display panel, a manufacturing method thereof, and a mobile terminal, for alleviating the risk that the metal trace of the existing display panel is broken in the bending area.

Referring to FIGS. 2 to 6, the present application provides a display panel, a manufacturing method thereof, and a mobile terminal. The display panel includes a display area and a bending area located at a side of the display area. The display panel includes a base, a metal layer and an organic film layer, which are laminated in order. The metal layer includes a metal trace, and at least a part of the metal trace is located in the bending area. The organic film layer at least covers the metal trace. The display panel further includes an ultraviolet blocking layer disposed at a side of the organic film layer away from the metal layer. A projection of the ultraviolet blocking layer covers the bending area.

In the present application, an ultraviolet blocking layer is provided at a side of the organic film layer away from the metal layer. The ultraviolet blocking layer is located at least in the bending area, and in the bending area the orthographic projection of the ultraviolet blocking layer onto the base covers the orthographic projection of the organic film layer onto the base. In this way, drawbacks of the existing art are avoided. In the existing art, an increase of the elastic modulus of the organic film layer and a decrease of the stretching rate of the organic film layer are caused when the organic film layer is irradiated by the ultraviolet light. As a result, it is easy for the organic film layer in the bending area to have cracks, and the metal trace located below the organic film layer thus has a risk of being broken, thereby causing poor vertical bright lines for the display panel.

The technical solutions of the present application will be described with reference to embodiments as follows.

Figure 2:
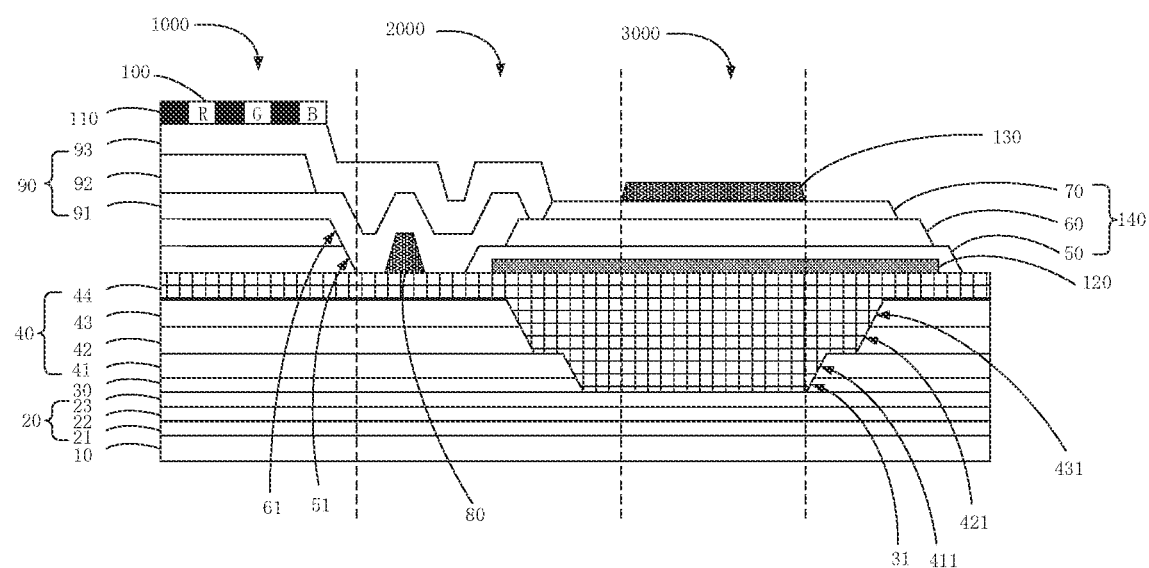
FIG. 2 is a first type of schematic cross-sectional view of a display panel provided in an embodiment of the present application.

FIG. 2 is a first type of schematic cross-sectional view of a display panel provided in an embodiment of the present application.

The present embodiment provides a display panel. The display panel includes, but is not limited to, an organic light emitting diode (OLED) display panel, which is not specifically limited in this embodiment. It needs to be noted that the present embodiment is given by taking the organic light emitting diode display panel as an example of the display panel for illustration of the technical solution of the present application.

In the present embodiment, the display panel includes a display area 1000, a bending area 3000, and a transition area 2000 located between the display area 1000 and the bending area 3000. The display panel includes a glass substrate 10, a base 20, a buffer layer 30, an array substrate 40, an organic film layer 140 and a thin-film encapsulating layer 90, which are laminated in order. The array substrate 40 includes, but is not limited to, an active layer (not shown in the figure), a first gate Insulating layer 41, a first gate layer (not shown in the figure), a second gate insulating layer 42, a second gate layer (not shown in the figure), a dielectric layer 43, a first metal layer (not shown in the figure), a first flat layer 44 and a second metal layer (not marked in the figure).

In the present embodiment, the base 20 includes a first substrate 21, a spacing layer 22 and a second substrate 23 that are sequentially stacked. Both the first substrate 21 and the second substrate 23 are flexible substrates, and their material may include at least one of acrylic resin, methacrylic resin, polyisoprene, vinyl resin, epoxy resin, polyurethane-based resin, cellulose resin, siloxane resin, polyimide-based resin and polyamide-based resin. Preferably, the material of the first substrate 21 and the second substrate 23 is polyimide. The material of the spacing layer 22 is silicon nitride (SiNx), silicon oxide (SiOx) or the like, and these materials have a water absorption capability.

In the present embodiment, the material of the first metal layer and the second metal layer may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta) and tungsten (W). The material of the first metal layer and the second metal layer is not limited in the present embodiment. Further, the first metal layer includes, but is not limited to, a first source-drain layer. The second metal layer includes, but is not limited to, a second source-drain layer and the metal traces 120 extending from the transition area 2000 to the bending area 3000.

The organic film layer 140 is located at a side of the second metal layer away from the first metal layer. The organic film layer 140 covers at least the metal trace 120. Further, the organic film layer 140 includes, but it is not limited to, the second flat layer 50 located on the second metal layer, the pixel definition layer 60 and the pad layer 70.

In the present embodiment, the display panel further includes an ultraviolet blocking layer 130 disposed at a side of the organic film layer 140 away from the second metal layer. The projection of the ultraviolet blocking layer 130 covers the bending area 3000. Specifically, the ultraviolet blocking layer 130 is located at least in the bending area 3000, and in the bending area 3000 the orthographic projection of the ultraviolet blocking layer 130 onto the base 20 covers the orthographic projection of the organic film layer 140 onto the base 20.

It should be noted that in the present embodiment the ultraviolet blocking layer 130 located at least in the bending area 3000 is merely for illustration, and it is not specifically limited in the present embodiment.

It can be understood that in the existing art, when the ultraviolet light irradiates at the organic film layer 140, it will cause an increase of the elastic modulus of the organic film layer 140 and a decrease of the stretching rate of the organic film layer 140. As a result, it is easy for the organic film layer 140 in the bending area 3000 to have cracks, and the metal trace 120 located below the organic layer 140 thus has a risk of being broken, thereby causing poor vertical bright lines for the display panel. Examples of irradiating the organic layer using the ultraviolet light include, not are not limited to, using the ultraviolet light to fabricate film layers of the display panel. In the present embodiment, an ultraviolet blocking layer 130 is provided at a side of the organic film layer 140 away from the metal layer. The projection of the ultraviolet blocking layer 130 covers the bending area 3000, that is, in the bending area 3000 the orthographic projection of the ultraviolet blocking layer 130 onto the base 20 covers the orthographic projection of the organic film layer 140 onto the base 20. Therefore, it is avoided drawbacks of the existing art, that is, an increase of the elastic modulus of the organic film layer 140 and a decrease of the stretching rate of the film organic layer 140 are caused when the organic film layer 140 is irradiated by the ultraviolet light, and this increases a risk that the metal trace is broken, thereby preventing the display panel from having poor vertical bright lines.

Specifically, in the present embodiment, the material of the ultraviolet blocking layer 130 includes a light absorbing material. Preferably, the light absorbing material is an ultraviolet light absorber, and the absorbing material is uniformly distributed in the ultraviolet blocking layer 130.

It can be understood that in the present embodiment the material of the ultraviolet blocking layer 130 includes a light absorbing material, and the light absorbing material is preferably a light absorber that absorbs ultraviolet light. When light rays with a particular wavelength (such as ultraviolet light) are used to irradiate at the bending area 3000 of the display panel, the ultraviolet blocking layer 130 protects the organic film layer 140 in the bending area 3000.

In the present embodiment, the display panel further includes a thin-film encapsulating layer 90, a color film layer 100 and a black matrix 110 that are located at a side of the organic film layer 140 away from the array substrate 40. The color film layer 100 includes a plurality of sub color filters (not marked in the figure) arranged in the display area 1000 at intervals. It should be noted that the plurality of sub color filters include, but are not limited to, red sub color filters R, green sub color filters G and blue sub color filters B. The black matrix 110 is disposed between two adjacent sub color filters and is configured to define the boundary between the sub color filters. Further, in order to prevent light leakage occurred between adjacent sub color filters, the edges of the sub color filters usually overlap with the black matrix 110.

Further, in the present embodiment, the buffer layer 30 is perforated to form a first through hole 31. The first through hole 31 is located at least in the bending area 3000 of the display panel. Preferably, the orthographic projection of the first through hole 31 onto the base 20 is at least partially located in the transition area 2000 and covers the bending area 3000. The first gate insulating layer 41 is perforated to form a second through hole 411. The second through hole 411 is disposed corresponding to the first through hole 31. The second gate insulating layer 42 is perforated to form a third through hole 421. The third through hole 421 is disposed corresponding to the second through hole 411. The dielectric layer 43 is perforated to form a fourth through hole 431. The fourth through hole 431 is disposed corresponding to the third through hole 421. The first flat layer 44 fills up the first through hole 31, the second through hole 411, the third through hole 421 and the fourth through hole 431.

It can be understood that in the present embodiment the first through hole 31, the second through hole 411, the third through hole 421 and the fourth through hole 431 are provided in the bending area 3000 such that the thickness of the display panel in the bending area 3000 is less than the thickness of the display panel in the display area 1000. This is equivalent to reducing the thickness of the display panel in the bending area 3000, lowering the elastic modulus in the bending area 3000. Also, the first through hole 31, the second through hole 411, the third through hole 421 and the fourth through hole 431 are filled with the first flat layer 44. Since the elastic modulus of the first flat layer 44 is small, the display panel has better bending properties in the bending area 3000.

It should be noted that in the present embodiment the thin-film encapsulating layer 90 includes a first inorganic layer 91, a first organic layer 92 and a second inorganic layer 91, which are laminated above the organic film layer 140 away from the second metal layer. The second flat layer 50 also includes a first trench 51 located at least in the transition area 2000. The pixel definition layer 60 also includes a second trench 61 located at least in the transition area 2000. The second trench 61 is disposed corresponding to the first trench 51. The display panel further includes a first dam 80 located in the first trench 51. The height of the first dam 80 is greater than or equal to the sum of depths of the first trench 51 and the second trench 61. The first inorganic layer 91 fills in the first trench 51 and the second trench 61 and covers the first dam 80.

Figure 3:
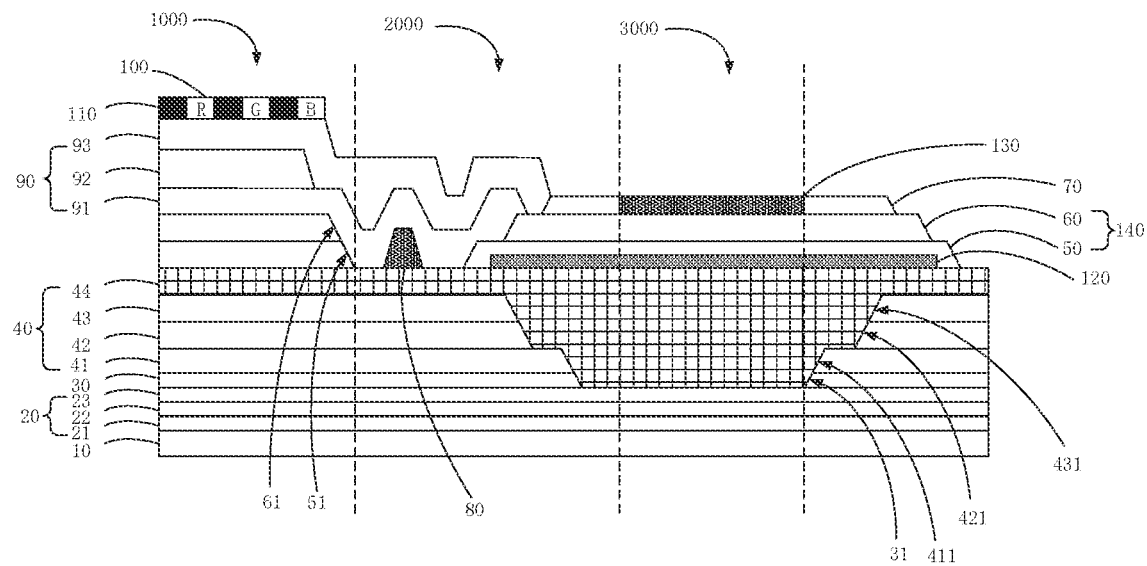
FIG. 3 is a second type of schematic cross-sectional view of a display panel provided in an embodiment of the present application.

FIG. 3 is a second type of schematic cross-sectional view of a display panel provided in an embodiment of the present application.

In the present embodiment, the structure of the display panel is similar to or as same as the first structure of the display panel provided in above embodiment. Please refer to the description of the display panel in above embodiment for details, which will not be elaborated herein. The differences between them are described below.

In the present embodiment, the material of the ultraviolet blocking layer 130 further includes a photoresist material. The light absorbing material is an ultraviolet light absorber, wherein the ultraviolet light absorber is uniformly distributed in the ultraviolet blocking layer 130.

The photoresist material includes, but is not limited to, polyimide. The ultraviolet light absorber includes, but is not limited to, any of phenyl salicylate and dihydroxybenzophenone, which are compounds with an ultraviolet light absorption function. In the ultraviolet blocking layer 130, the mass fraction of the ultraviolet light absorber is 10% to 50%, which is not specifically limited in the present embodiment.

Specifically, in the present embodiment, the display panel further includes a pad layer 70 disposed at a side of the organic film layer 140 away from the metal layer. The pad layer 70 includes the ultraviolet blocking layer 130. The organic film layer 140 includes a second flat layer 50 and a pixel definition layer 60, which are laminated. The second flat layer 50 is located at a side of the second metal layer away from the first flat layer 44. The ultraviolet blocking layer 130 covers a portion of the second flat layer 50 in the bending area 3000. The ultraviolet blocking layer 130 covers a portion of the pixel definition layer 60 in the bending area 3000.

It should be noted that in the present embodiment the ultraviolet blocking layer 130 located at least in the bending area 3000 is merely for illustration, and it is not specifically limited in the present embodiment.

It can be understood that in the present embodiment the material of the ultraviolet blocking layer 130 includes a photoresist material and an ultraviolet light absorber, wherein the ultraviolet light absorber is uniformly distributed in the ultraviolet blocking layer 130. Compared to the foregoing embodiment, in the present embodiment, the pad layer 70 includes the ultraviolet blocking layer 130. Therefore, it is avoided drawbacks of the existing art, that is, an increase of the elastic modulus of the organic film layer 140 and a decrease of the stretching rate of the organic film layer 140 are caused when the organic film layer 140 is irradiated by the ultraviolet light, and as a result, it is easy for the organic film layer 140 in the bending area 3000 to have cracks, and the metal trace 120 located below the organic film layer 140 thus has a risk of being broken, thereby causing poor vertical bright lines for the display panel. Also, in the present embodiment, an ultraviolet light absorber is added to the material of original pad layer 70 of the existing display panel, wherein the ultraviolet light absorber is uniformly distributed in the ultraviolet blocking layer 130. It can be avoided to add a new film layer into the existing display panel, which will affect the thickness of the display panel. Also, the cost of manufacturing processes of the display panel is saved.

Further, in an embodiment, a portion of at least one of the second flat layer 50 and the pixel definition layer 60 located in the bending area 3000 is filled with the ultraviolet light absorber. Specifically, a portion of the second flat layer 50 located in the bending area 3000 is filled with the ultraviolet light absorber. A portion of the pixel definition layer 60 located in the bending area 3000 is filled with the ultraviolet light absorber. It can be understood that in the present embodiment, the material of the ultraviolet blocking layer 130 includes a photoresist material and the ultraviolet light absorber, a portion of the second flat layer 50 located in the bending area 3000 is filled with the ultraviolet light absorber, and a portion of the pixel definition layer 60 located in the bending area 3000 is filled with the ultraviolet light absorber. This improves the capability of the organic film layer 140 to resist radiation of ultraviolet light. Therefore, it is better avoided drawbacks of the existing art, that is, an increase of the elastic modulus of the organic film layer 140 and a decrease of the stretching rate of the organic film layer 140 are caused when the organic film layer 140 is irradiated by the ultraviolet light, and as a result, it is easy for the organic film layer 140 in the bending area 3000 to have cracks, and the metal trace 120 located below the organic film layer 140 thus has a risk of being broken, thereby causing poor vertical bright lines for the display panel.

Figure 4:
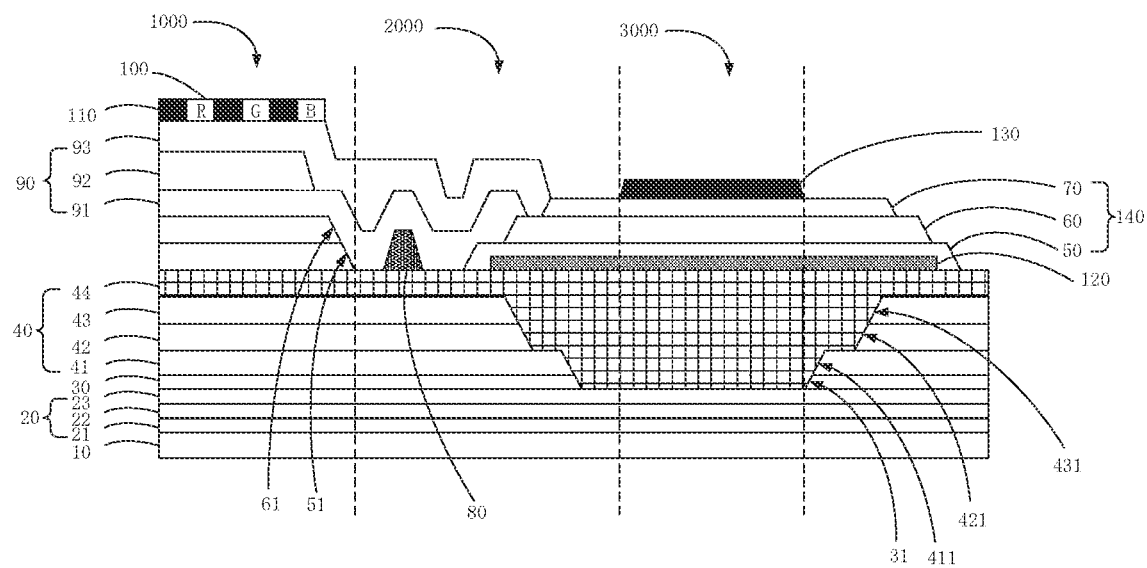
FIG. 4 is a third type of schematic cross-sectional view of a display panel provided in an embodiment of the present application.

FIG. 4 is a third type of schematic cross-sectional view of a display panel provided in an embodiment of the present application.

In the present embodiment, the structure of the display panel is similar to or as same as the first structure of the display panel provided in above embodiment. Please refer to the description of the display panel in above embodiment for details, which will not be elaborated herein. The differences between them are described below.

In the present embodiment, the light absorbing material includes, but is not limited to, the material of the black matrix 110. Further, the material of the ultraviolet blocking layer 130 is as the same as the material of the black matrix 110.

It can be understood that the material of the black matrix 110 has a light absorbing ability. By setting the material of the ultraviolet blocking layer 130 as the material of the black matrix 110, the ultraviolet blocking layer 130 is located at least in the bending area 3000, and the orthographic projection of the ultraviolet blocking layer 130 onto the base 20 covers the orthographic projection of the organic film layer 140 onto the base 20. Therefore, it is avoided drawbacks of the existing art, that is, an increase of the elastic modulus of the organic film layer 140 and a decrease of the stretching rate of the organic film layer 140 are caused when the organic film layer 140 is irradiated by the ultraviolet light, and as a result, it is easy for the organic film layer 140 in the bending area 3000 to have cracks, and the metal trace 120 located below the organic film layer 140 thus has a risk of being broken, thereby causing poor vertical bright lines for the display panel. Also, in the present embodiment, the material of the ultraviolet blocking layer 130 is set to be as the same as the material of the block matrix 110. Therefore, the ultraviolet blocking layer 130 and the black matrix 110 can be fabricated using a single one mask process. The cost of manufacturing processes of the display panel is saved.

It should be noted that in the present embodiment, the thickness of the ultraviolet blocking layer 130 is less than the thickness of the second flat layer 50. Specifically, the thickness of the ultraviolet blocking layer 130 ranges from 1 um to 1.5 um. It can be understood that in the present embodiment, the ultraviolet blocking layer is located in the bending area 3000, and when the ultraviolet blocking layer 130 is too thick, it will affect the bending area 3000 of the display panel. Therefore, in the present embodiment, by setting the thickness of the ultraviolet blocking layer 130 to be 1 um to 1.5 um, the stress suffered by the display panel from the ultraviolet blocking layer 130 during a bending process can be reduced, thereby preventing the ultraviolet blocking layer 130 from affecting the bending properties of the display panel. It can be understood that the thickness of the ultraviolet blocking layer 130 is not specifically limited in the present embodiment.

FIG. 5 is a fourth type of schematic cross-sectional view of a display panel provided in an embodiment of the present application.

In the present embodiment, the structure of the display panel is similar to or as same as the third structure of the display panel provided in above embodiment. Please refer to the description of the display panel in above embodiment for details, which will not be elaborated herein. The differences between them are described below.

In the present embodiment, the display panel further includes a shielding layer 150 located between the glass substrate 20 and the first substrate 21. The material of the shielding layer 150 is as the same as the material of the ultraviolet blocking layer 130. The orthographic projection of the ultraviolet blocking layer 130 onto the base 20 overlaps with the orthographic projection of the shielding layer 150 onto the base 20. Specifically, in the present embodiment, both the material of the shielding layer 150 and the material of the ultraviolet blocking layer 130 are the same and are the material of the black matrix 110.

It should be noted that when the display panel is in a bending state, a neutral layer will occur in the bending area 3000. Because the ultraviolet blocking layer 130 is fabricated at a side of the organic film layer 140 away from the metal trace 120 in the present embodiment and the material of the ultraviolet blocking layer 130 is the material of the black matrix 110, it will cause a shift of the neutral layer in the display panel and the metal trace 120 located in the neutral layer has a risk of being broken. In the present embodiment, the shielding layer 150 is provided between the glass substrate 20 and the first substrate 21, the shielding layer 150 is located in the bending area 3000, the material of the shielding layer 150 is as the same as the material of the ultraviolet blocking layer 130, and the orthographic projection of the ultraviolet blocking layer 130 onto the base 20 overlaps with the orthographic projection of the shielding layer 150 onto the base 20. This ensures that in the display panel the stress suffered by the metal trace 120 is zero, and the metal trace 120 is a neutral layer, thereby reducing the risk that the metal trace 120 is broken.

FIG. 6 is a flowchart of a method of manufacturing a display panel provided in an embodiment of the present application.

The present embodiment provides a method of manufacturing a display panel. The display panel includes a display area 1000, a bending area 3000 and a transition area 2000 located between the display area 1000 and the bending area 3000. The manufacturing method includes the following steps:

Step S10: providing a base 20 and sequentially fabricating a metal layer and an organic film layer 140 on the base 20, wherein the metal layer includes a metal trace 120, at least a part of the metal trace 120 is located in the bending area 3000, and the organic film layer 140 covers at least the metal trace 120.

Referring to FIG. 3, in an embodiment, Step S10 includes the following steps:

Step S11: providing a glass substrate 10 and coating a polyimide solution on the glass substrate 10 to form a first substrate 21; utilizing chemical vapor deposition (CVD) to fabricate a spacing layer 22 at a side of the first substrate 21 away from the glass substrate 10, wherein the material of spacing layer 22 includes, but is not limited to, silicon nitride (SiNx), silicon oxide (SiOx) or the like, and these material has an water absorption capability; coating a polyimide solution at a side of the spacing layer 22 away from the first substrate 21 to form a second substrate 23.

Step S12: utilizing CVD to fabricate a buffer layer 30 at a side of the second substrate 23 away from the spacing layer 22, and forming a first through hole 31 on the buffer layer 30. The first through hole 31 is located at least in the bending area 3000 of the display panel. Preferably, the orthographic projection of the first through hole 31 onto the base 20 is located at least partially in the transition area 2000 and covers the bending area 3000.

Step S13: sequentially fabricating an active layer, a first gate insulating layer 41, a first gate layer, a second gate insulating layer 42, a second gate layer and a dielectric layer 43 at a side of the buffer layer 30 away from the second substrate 23.

Step S13 includes the following steps:

Step S131: fabricating the active layer at a side of the buffer layer 30 away from the second substrate 23 by means of excimer laser annealing (ELA).

Step S132: utilizing CVD to fabricate the first gate insulating layer 41 at a side of the active layer away from the buffer layer 30, and forming a second through hole 411 on the first gate insulating layer 41, wherein the second through hole 411 is disposed corresponding to spacing the first through hole 31.

Step S133: utilizing physical vapor deposition (PVD) to fabricate the first gate layer at a side of the first gate insulating layer 41 away from the active layer.

Step S134: utilizing CVD to fabricate the second gate insulating layer 42 at a side of the first gate layer away from the first gate insulating layer 41, and forming a third through hole 421 on the second gate insulating layer 42, wherein the third through hole 421 is disposed corresponding to spacing the second through hole 411.

Step S135: utilizing PVD to fabricate the second gate layer at a side of the second gate insulating layer 42 away from the first gate layer.

Step S136: utilizing CVD to fabricate the dielectric layer 43 at a side of the second gate layer away from the second gate insulating layer 42, and forming a fourth through hole 431 on the dielectric layer 43, wherein the fourth through hole 431 is disposed corresponding to spacing the third through hole 421.

Step S14: utilizing PVD to fabricate a first metal layer at a side of the dielectric layer 43 away from the second gate layer, wherein the first metal layer includes, but is not limited to, a first source-drain layer.

Step S15: fabricating a first flat layer 44 at a side of the first metal layer away from the dielectric layer 43, wherein the first flat layer 44 fills up the first through holes 31 and the second through holes 411, the third through hole 421 and the fourth through hole 431.

It can be understood that in the present embodiment the first through hole 31 and the second through hole are provided in the bending area 3000 such that the thickness of the display panel in the bending area 3000 is less than the thickness of the display panel in the display area 1000 and the transition area 2000. This is equivalent to reducing the thickness of the display panel in the bending area 3000, lowering the elastic modulus in the bending area 3000. Also, the first through hole 31 and the second through hole are filled with the first flat layer 44. Since the elastic modulus of the first flat layer 44 is small, the display panel has better bending properties.

Step S16: utilizing PVD to fabricate a second metal layer at a side of the first flat layer 44 away from the first metal layer. The second metal layer includes, but is not limited to, a second source-drain layer and the metal trace 120, and at least a part of the metal trace 120 is located in the bending area 3000.

It needs to be noted that in the present embodiment the material of the first metal layer and the second metal layer may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta) and tungsten (W). The material of the first metal layer and the second metal layer is not limited in the present embodiment.

Step S17: fabricating the organic film layer 140 at a side of the second metal layer away from the first flat layer 44.

Step S17 includes the following steps:

Step S171: fabricating a second flat layer 50 at a side of the second metal layer away from the first flat layer 44. The orthographic projection of the second flat layer 50 onto the thin film substrate at least covers the orthographic projection of the metal trace 120 onto the thin film substrate.

Step S172: perforating the second flat layer 50 to form a first trench 51. The first trench 51 is located at least in the transition area 2000.

Step S173: fabricating a pixel definition layer 60 at a side of the second flat layer 50 away from the second metal layer, and perforating the pixel definition layer 60 to form a second trench 61. The second trench 61 is located at least in the transition zone 2000. The second trench 61 is disposed corresponding to the first trench 51.

Step S20: fabricating an ultraviolet blocking layer 130 on the organic film layer 140. The projection of the ultraviolet blocking layer 130 covers the bending area 3000. Specifically, the ultraviolet blocking layer 130 is located at least in the bending area 3000, and in the bending area 3000 the orthographic projection of the ultraviolet blocking layer 130 onto the base 20 covers the orthographic projection of the organic film layer 140 onto the base 20.

From above, in an embodiment, Step S20 includes the following steps:

Step S21: fabricating a pad layer 70 at a side of the organic film layer 140 away from the second metal layer. The pad layer 70 includes the ultraviolet blocking layer 130. The material of the ultraviolet blocking layer 130 includes a photoresist material and an ultraviolet light absorber, wherein the ultraviolet light absorber is uniformly distributed in the ultraviolet blocking layer 130.

It needs to be noted that the photoresist material includes, but is not limited to, polyimide. The ultraviolet light absorber includes, but is not limited to, any of phenyl salicylate and dihydroxybenzophenone, which are compounds with an ultraviolet light absorption function. In the ultraviolet blocking layer 130, the mass fraction of the ultraviolet light absorber is 10% to 50%, which is not specifically limited in the present embodiment.

In the present embodiment, the manufacturing method of the display panel further includes the following steps:

Step S30: fabricating a first dam 80 in the first trench 51. The height of the first dam 80 is greater than or equal to the sum of depths of the first trench 51 and the second trench 61.

Step S40: utilizing ultraviolet light (UA) to fabricate a thin-film encapsulating layer 90 at a side of the pad layer 70 away from the organic film layer 140. The thin-film encapsulating layer 90 includes a first inorganic layer 91, a first organic layer 92 and a second inorganic layer 93. The first inorganic layer 91 fills in the first trench 51 and the second trench 61 and covers the first dam 80. The first organic layer 92 is fabricated by an inkjet printing process, and the first dam 80 can effectively confine a large amount of ink to be within the first trench 51 and the second trench 61 as much as possible.

Step S50: utilizing ultraviolet light (UA) to fabricate a touch sensitive substrate (not shown in the figure) at a side of the thin-film encapsulating layer 90 away from the pad layer 70.

Step S60: fabricating a color film layer 100 and a black matrix 110 at a side of the touch sensitive substrate away from the thin-film encapsulating layer 90.

Step S70: fabricating a glass cover (not shown in the figure) at a side of the color film layer 100 away from the touch sensitive substrate.

It can be understood that in the existing art, when the ultraviolet light irradiates at the organic film layer (for example, the afore-described manufacturing processes of the thin-film encapsulating layer 90 and the touch sensitive substrate use the UV), it will cause an increase of the elastic modulus of the organic film layer 140 and a decrease of the stretching rate of the organic film layer 140. As a result, it is easy for the organic layer in the bending area 3000 to have cracks, and the metal trace 120 located below the organic layer thus has a risk of being broken, thereby causing poor vertical bright lines for the display panel. In the present application, the pad layer 70 is fabricated on the organic film layer 140, the pad layer 70 includes the ultraviolet blocking layer 130, the ultraviolet blocking layer 130 is located at least in the bending area 3000, and in the bending area 3000 the projection of the ultraviolet blocking layer 130 onto the base 20 covers the orthographic projection of the organic film layer 140 onto the base 20. Therefore, it is avoided drawbacks of the existing art, that is, an increase of the elastic modulus of the organic film layer 140 and a decrease of the stretching rate of the film organic layer 140 are caused when the organic film layer 140 is irradiated by the ultraviolet light, and as a result, it is easy for the organic film layer 140 in the bending area 3000 to have cracks, and the metal trace 120 located below the organic film layer 140 thus has a risk of being broken, thereby causing poor vertical bright lines for the display panel.

Also, in the present embodiment, an ultraviolet light absorber is added to the material of original pad layer 70 of the existing display panel, wherein the ultraviolet light absorber is uniformly distributed in the ultraviolet blocking layer 130. It can be avoided to add a new film layer into the existing display panel, which will affect the thickness of the display panel. Also, the cost of manufacturing processes of the display panel is saved.

Referring to FIG. 5, in an embodiment, Step S10 includes the following steps:

Step S11: providing a glass substrate 10 and fabricating a shielding layer 150 on the glass substrate 10. The shielding layer 150 is located at least in the bending area 3000. The material of the shielding layer 150 includes, but is not limited to, the material of black matrix 110.

Step S12: coating a polyimide solution on the shielding layer 150 to form a first substrate 21; utilizing chemical vapor deposition (CVD) to fabricate a spacing layer 22 at a side of the first substrate 21 away from the glass substrate 10, wherein the material of spacing layer 22 includes, but is not limited to, silicon nitride (SiNx), silicon oxide (SiOx) or the like, and these material has an water absorption capability; coating a polyimide solution at a side of the spacing layer 22 away from the first substrate 21 to form a second substrate 23.

Step S13: utilizing CVD to fabricate a buffer layer 30 at a side of the second substrate 23 away from the spacing layer 22, and forming a first through hole 31 on the buffer layer 30. The first through hole 31 is located at least in the bending area 3000 of the display panel. Preferably, the orthographic projection of the first through hole 31 onto the base 20 is located at least partially in the transition area 2000 and covers the bending area 3000.

Step S14: sequentially fabricating an active layer, a first gate insulating layer 41, a first gate layer, a second gate insulating layer 42, a second gate layer and a dielectric layer 43 at a side of the buffer layer 30 away from the second substrate 23.

Step S14 includes the following steps:

Step S141: fabricating the active layer at a side of the buffer layer 30 away from the second substrate 23 by means of excimer laser annealing (ELA).

Step S142: utilizing CVD to fabricate the first gate insulating layer 41 at a side of the active layer away from the buffer layer 30, and forming a second through hole 411 on the first gate insulating layer 41, wherein the second through hole 411 is disposed corresponding to the first through hole 31.

Step S143: utilizing physical vapor deposition (PVD) to fabricate the first gate layer at a side of the first gate insulating layer 41 away from the active layer.

Step S144: utilizing CVD to fabricate the second gate insulating layer 42 at a side of the first gate layer away from the first gate insulating layer 41, and forming a third through hole 421 on the second gate insulating layer 42, wherein the third through hole 421 is disposed corresponding to the second through hole 411.

Step S145: utilizing PVD to fabricate the second gate layer at a side of the second gate insulating layer 42 away from the first gate layer.

Step S146: utilizing CVD to fabricate the dielectric layer 43 at a side of the second gate layer away from the second gate insulating layer 42, and forming a fourth through hole 431 on the dielectric layer 43, wherein the fourth through hole 431 is disposed corresponding to the third through hole 421.

Step S15: utilizing PVD to fabricate a first metal layer at a side of the dielectric layer 43 away from the second gate layer, wherein the first metal layer includes, but is not limited to, a first source-drain layer.

Step S16: fabricating a first flat layer 44 at a side of the first metal layer away from the dielectric layer 43, wherein the first flat layer 44 fills up the first through holes 31 and the second through holes 411, the third through hole 421 and the fourth through hole 431.

Step S17: utilizing PVD to fabricate a second metal layer at a side of the first flat layer 44 away from the first metal layer. The second metal layer includes, but is not limited to, a second source-drain layer and the metal trace 120, and at least a part of the metal trace 120 is located in the bending area 3000.

It needs to be noted that in the present embodiment the material of the first metal layer and the second metal layer may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta) and tungsten (W). The material of the first metal layer and the second metal layer is not limited in the present embodiment.

Step S18: fabricating the organic film layer 140 at a side of the second metal layer away from the first flat layer 44.

Step S18 includes the following steps:

Step S181: fabricating a second flat layer 50 at a side of the second metal layer away from the first flat layer 44. The orthographic projection of the second flat layer 50 onto the base 20 at least covers the orthographic projection of the metal trace 120 onto the base 20.

Step S182: perforating the second flat layer 50 to form a first trench 51. The first trench 51 is located at least in the transition area 2000.

Step S183: fabricating a pad layer 70 at a side of the second flat layer 50 away from the second metal layer. The orthographic projection of the pad layer 70 onto the base 20 at least covers the orthographic projection of the metal trace 120 onto the base 20.

Step S20: fabricating an ultraviolet blocking layer 130 on the organic film layer 140. The ultraviolet blocking layer 130 is located at least in the bending area 3000, and in the bending area 3000 the orthographic projection of the ultraviolet blocking layer 130 onto the base 20 covers the orthographic projection of the organic film layer 140 onto the base 20.

From above, in an embodiment, Step S20 includes the following steps:

Step S21: fabricating a first dam 80 in the first trench 51. The height of the first dam 80 is greater than or equal to the sum of heights of the second flat layer and the pixel definition layer.

Step S22: fabricating a thin-film encapsulating layer 90 on the organic film layer 140.

Specifically, Step S22 includes utilizing ultraviolet light (UA) to fabricate the thin-film encapsulating layer 90 at a side of the pad layer 70 away from the organic film layer 140. The thin-film encapsulating layer 90 includes a first inorganic layer 91, a first organic layer 92 and a second inorganic layer 93. The first inorganic layer 91 fills in the first trench 51. The first organic layer 92 is fabricated by an inkjet printing process, and the first dam 80 can effectively confine a large amount of ink to be within the first trench 51 as much as possible.

Step S23: fabricating a black matrix 110 and the ultraviolet blocking layer 130 on the thin-film encapsulating layer 90 at the same time, wherein the ultraviolet blocking layer 130 is located in the bending area 3000, and the material of the ultraviolet blocking layer 130 is as the same as the material of the black matrix 110.

In the present embodiment, Step 23 further includes fabricating a color film layer 100 on the organic film layer 140. The color film layer 100 includes a plurality of sub color filters arranged in the display area 1000 at intervals. It should be noted that the plurality of sub color filters include, but are not limited to, red sub color filters R, green sub color filters G and blue sub color filters B. The black matrix 110 is disposed between two adjacent sub color filters and is configured to define the boundary between the sub color filters. Further, in order to prevent light leakage occurred between adjacent sub color filters, the edges of the sub color filters usually overlap with the black matrix 110.

It should be noted that fabricating a black matrix 110 and the ultraviolet blocking layer 130 on the thin-film encapsulating layer 90 at the same time in Step S23 is only for illustration, and it is not specifically limited in the present embodiment. For example, in an embodiment, the ultraviolet blocking layer 130, the thin-film encapsulating layer 90 and the black matrix 110 may be fabricated at one time.

Step S30: utilizing ultraviolet light (UA) to fabricate a touch sensitive substrate (not shown in the figure) at a side of the thin-film encapsulating layer 90 away from the pad layer 70.

Step S40: fabricating a glass cover (not shown in the figure) at a side of the color film layer 100 away from the touch sensitive substrate.

It can be understood that the material of the black matrix 110 has a light absorbing ability. By fabricating the ultraviolet blocking layer 130 using the material of the black matrix 110, the ultraviolet blocking layer 130 is located at least in the bending area 3000, and in the bending area 3000 the orthographic projection of the ultraviolet blocking layer 130 onto the base 20 covers the orthographic projection of the organic film layer 140 onto the base 20. Therefore, it is avoided drawbacks of the existing art, that is, an increase of the elastic modulus of the organic film layer 140 and a decrease of the stretching rate of the organic film layer 140 are caused when the organic film layer 140 is irradiated by the ultraviolet light (for example, the afore-described manufacturing processes of the thin-film encapsulating layer 90 and the touch sensitive substrate use the UV), and as a result, it is easy for the organic film layer 140 in the bending area 3000 to have cracks, and the metal trace 120 located below the organic film layer 140 thus has a risk of being broken, thereby causing poor vertical bright lines for the display panel. Also, in the present embodiment, the material of the ultraviolet blocking layer 130 is set to be as the same as the material of the block matrix 110. Fabricating the ultraviolet blocking layer 130 and the black matrix 110 at the same time saves the cost of manufacturing processes of the display panel.

Further, in the present embodiment, the orthographic projection of the ultraviolet blocking layer 130 onto the base 20 overlaps with the orthographic projection of the shielding layer 150 onto the base 20.

It should be noted that when the display panel is in a bending state, a neutral layer will occur in the bending area 3000. Because the ultraviolet blocking layer 130 is fabricated at a side of the organic film layer 140 away from the metal trace 120 in the present embodiment and the material of the ultraviolet blocking layer 130 is the material of the black matrix 110, it will cause a shift of the neutral layer in the display panel and the metal trace 120 located in the neutral layer has a risk of being broken. In the present embodiment, the shielding layer 150 is provided between the glass substrate 20 and the first substrate 21, the shielding layer 150 is located in the bending area 3000, the material of the shielding layer 150 is as the same as the material of the ultraviolet blocking layer 130, and the orthographic projection of the ultraviolet blocking layer 130 onto the base 20 overlaps with the orthographic projection of the shielding layer 150 onto the base 20. This ensures that in the display panel the stress suffered by the metal trace 120 is zero, and the metal trace 120 is a neutral layer, thereby reducing the risk that the metal trace 120 is broken.

The present embodiment provides a mobile terminal. The mobile terminal includes a terminal body and the display panel according to any of the foregoing embodiments. The terminal body and the display panel are combined as one.

It can be understood that the display panel has been described in detail in above embodiments and will not be elaborated herein.

In specific applications, the mobile terminal can be a display screen of a device such as a smart phone, a tablet computer, a notebook computer, a smart band, a smartwatch, a smart glasses, a smart helmet, a desktop computer, a smart TV, a digital camera, and etc., or even can be applied to electronic devices with flexible display screens.

In summary, the present application provides a display panel, a manufacturing method thereof, and a mobile terminal. The display panel includes a display area and a bending area located at a side of the display area. The display panel includes a base, a metal layer and an organic film layer, which are laminated in order. The metal layer includes a metal trace, and at least a part of the metal trace is located in the bending area. The organic film layer at least covers the metal trace. In the present application, an ultraviolet blocking layer is disposed at a side of the organic film layer away from the metal layer. The ultraviolet blocking layer is located at least in the bending area, and in the bending area the orthographic projection of the ultraviolet blocking layer onto the base covers the orthographic projection of the organic film layer onto the base. In this way, drawbacks of the existing art are avoided, that is, an increase of the elastic modulus of the organic film layer and a decrease of the stretching rate of the organic film layer are caused when the organic film layer is irradiated by the ultraviolet light, and as a result, this increases a risk that the metal trace is broken.

It should be understood that those of ordinary skill in the art may make equivalent modifications or variations according to the technical schemes and invention concepts of the present application, but all such modifications and variations should be within the appended claims of the present application.

The invention claimed is:

1. A display panel, comprising:
a display area and a bending area located at a side of the display area;
a base, an array substrate, and an organic film layer, which are laminated in order, wherein the array substrate comprises a metal layer and a first flat layer, the metal layer comprises a metal trace, at least a part of the metal trace is located in the bending area, the organic film layer at least covers the metal trace, and the metal trace is formed on the first flat layer; and
an ultraviolet blocking layer disposed at a side of the organic film layer away from the metal layer, wherein a projection of the ultraviolet blocking layer covers the bending area.

2. The display panel of claim 1, wherein a material of the ultraviolet blocking layer comprises a light absorbing material.

3. The display panel of claim 2, wherein the display panel further comprises a pad layer disposed at a side of the organic film layer away from the metal layer, the pad layer comprises the ultraviolet blocking layer, and the ultraviolet blocking layer is located in the bending area.

4. The display panel of claim 3, wherein the material of the ultraviolet blocking layer further comprises a photoresist material, the light absorbing material is an ultraviolet light absorber, and the ultraviolet light absorber is uniformly distributed in the ultraviolet blocking layer.

5. The display panel of claim 4, wherein the organic film layer comprises an organic flat layer and a pixel definition layer, which are laminated, and a portion of at least one of the organic flat layer and the pixel definition layer located in the bending area is filled with the ultraviolet light absorber.

6. The display panel of claim 5, wherein a portion of the organic flat layer located in the bending area is filled with the ultraviolet light absorber, and a portion of the pixel definition layer located in the bending area is filled with the ultraviolet light absorber.

7. The display panel of claim 4, wherein in the ultraviolet blocking layer, a mass fraction of the ultraviolet light absorber is in a range from 10% to 50%.

8. The display panel of claim 2, wherein the light absorbing material is a material of a black matrix.

9. The display panel of claim 8, wherein the display panel further comprises a glass substrate located at a side of the base away from the metal layer and a shielding layer located between the glass substrate and the base, a material of the shielding layer is as same as a material of the ultraviolet blocking layer, and an orthographic projection of the ultraviolet blocking layer onto the glass substrate overlaps with an orthographic projection of the shielding layer onto the glass substrate.

10. The display panel of claim 8, wherein a thickness of the ultraviolet blocking layer is in a range from 1 um to 1.5 um.

11. A mobile terminal, comprising a terminal body and a display panel, the terminal body and the display panel are combined as one, wherein the display panel comprises:
a display area and a bending area located at a side of the display area;
a base, an array substrate, and an organic film layer, which are laminated in order, wherein the array substrate comprises a metal layer and a first flat layer, the metal layer comprises a metal trace, at least a part of the metal trace is located in the bending area, the organic film layer at least covers the metal trace, and the metal trace is formed on the first flat layer; and
an ultraviolet blocking layer disposed at a side of the organic film layer away from the metal layer, wherein a projection of the ultraviolet blocking layer covers the bending area.

12. The mobile terminal of claim 11, wherein a material of the ultraviolet blocking layer comprises a light absorbing material.

13. The mobile terminal of claim 12, wherein the display panel further comprises a pad layer disposed at a side of the organic film layer away from the metal layer, the pad layer comprises the ultraviolet blocking layer, and the ultraviolet blocking layer is located in the bending area.

14. The mobile terminal of claim 13, wherein the material of the ultraviolet blocking layer further comprises a photoresist material, the light absorbing material is an ultraviolet light absorber, and the ultraviolet light absorber is uniformly distributed in the ultraviolet blocking layer.

15. The mobile terminal of claim 14, wherein the organic film layer comprises an organic flat layer and a pixel definition layer, which are laminated, a portion of at least one of the organic flat layer and the pixel definition layer located in the bending area is filled with the ultraviolet light absorber.

16. The mobile terminal of claim 15, wherein a portion of the organic flat layer located in the bending area is filled with the ultraviolet light absorber, and a portion of the pixel definition layer located in the bending area is filled with the ultraviolet light absorber.

17. The mobile terminal of claim 14, wherein in the ultraviolet blocking layer, a mass fraction of the ultraviolet light absorber is in a range from 10% to 50%.

18. A display panel, comprising:
a display area and a bending area located at a side of the display area;
a base, a metal layer, and an organic film layer, which are laminated in order, wherein the metal layer comprises a metal trace, at least a part of the metal trace is located in the bending area, and the organic film layer at least covers the metal trace;
an ultraviolet blocking layer disposed at a side of the organic film layer away from the metal layer, and a projection of the ultraviolet blocking layer covers the bending area; and
a pad layer disposed at a side of the organic film layer away from the metal layer, wherein the pad layer comprises the ultraviolet blocking layer, and the ultraviolet blocking layer is located in the bending area.

19. The display panel of claim 18, wherein a material of the ultraviolet blocking layer comprises a light absorbing material and a photoresist material, the light absorbing material is an ultraviolet light absorber, and the ultraviolet light absorber is uniformly distributed in the ultraviolet blocking layer.

20. The display panel of claim 19, wherein the organic film layer comprises an organic flat layer and a pixel definition layer, which are laminated, and a portion of at least one of the organic flat layer and the pixel definition layer located in the bending area is filled with the ultraviolet light absorber.

* * * * *